United States Patent
Ohtani

(10) Patent No.: US 6,778,432 B2
(45) Date of Patent: Aug. 17, 2004

(54) THIN FILM MAGNETIC MEMORY DEVICE CAPABLE OF STABLY WRITING/READING DATA AND METHOD OF FABRICATING THE SAME

(75) Inventor: Jun Ohtani, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/387,536

(22) Filed: Mar. 14, 2003

(65) Prior Publication Data

US 2004/0052107 A1 Mar. 18, 2004

(30) Foreign Application Priority Data

Sep. 12, 2002 (JP) ........................................ 2002-266891

(51) Int. Cl.[7] .............................................. G11C 11/14
(52) U.S. Cl. .................... 365/171; 365/158; 365/230.07
(58) Field of Search ................................ 365/171, 158, 365/230.07, 210, 225.5

(56) References Cited

U.S. PATENT DOCUMENTS 6,272,040 B1 * 8/2001 Salter et al. ................. 365/158
6,324,093 B1   11/2001 Perner et al.

OTHER PUBLICATIONS

Scheuerlein et al., "A 10ns Read and Write Non–Violatile Memory Array Using A Magnetic Tunnel Junction and FET Switch in Each Cell", ISSCC Digest of Technical Papers, TA7.2, Feb. 2000, pp. 94–95, 128–129, 409–410.

Durlam et al., "Nonviolatile RAM based on Magnetic Tunnel Junction Elements", ISSCC Digest of Technical Papers TA7.3, Feb. 2000, pp. 96–97, 130–131, 410–411.

Naji et al., "A 256kb 3.0V IT1MTJ Nonvolatile Magnetoresistive RAM", ISSCC Digest of Technical Papers, TA7.6, Feb. 2001, pp. 94–95, 122–123, 404–405, 438.

* cited by examiner

Primary Examiner—David Lam
(74) Attorney, Agent, or Firm—Burns, Doane, Swecker & Mathis, L.L.P.

(57) ABSTRACT

A thin film magnetic memory device includes a plurality of program cells each storing program data constituting information on a bit unit basis, each program cell having a magnetic storing part having first and second electric resistors corresponding to two magnetization directions. The thin film magnetic memory device further includes: a driver circuit for irreversibly fixing a resistance value of the magnetic storing part in the program cell to a third electric resistor; and a sense driver circuit capable of sensing whether the magnetic storing part in the program cell has the first or second electric resistance and capable of sensing whether the magnetic storing part in the program cell has any one of the first or second resistances, or the third electric resistance.

7 Claims, 14 Drawing Sheets

THIN FILM MAGNETIC MEMORY DEVICE CAPABLE OF STABLY WRITING/READING DATA AND METHOD OF FABRICATING THE SAME

BACKGROUND OF THE INVENTION

1. Field of the Invention

The present invention relates to a thin film magnetic memory device and a method of fabricating the same, and more particularly to a thin film magnetic memory device having a redundant configuration for repairing a defective memory cell and a method of fabricating the same.

2. Description of the Background Art

As a memory device capable of storing data in a nonvolatile manner with low power consumption, attention is being paid to an MRAM (Magnetic Random Access Memory) device. The MRAM device is a memory device for storing data in a nonvolatile manner by using a plurality of thin film magnetic materials formed on a semiconductor integrated circuit. Each of the thin film magnetic materials can be accessed at random.

Particularly, in recent years, it has been announced that the performance of an MRAM device is dramatically improved by using a thin film magnetic material utilizing a magnetic tunnel junction (MTJ) as a memory cell. An MRAM device including memory cells each having a magnetic tunnel junction is disclosed in the following Literature 1 to 3.

(Literature 1)

Roy Scheuerlein and six others, "A 10 ns Read and Write Non-Volatile Memory Array Using a Magnetic Tunnel Junction and, FET Switch in each Cell", (U.S.A.), 2000 IEEE ISSCC Digest of Technical Papers, TA7.2

(Literature 2)

M. Durlam and five others, "Nonvolatile RAM based on Magnetic Tunnel Junction Elements", (U.S.A.), 2000 IEEE ISSCC Digest of Technical Papers, TA7. 3

(Literature 3)

Peter K. Naji and four others, "A 256 kb 3.0V 1T1MTJ Nonvolatile Magnetoresistive RAM", (U.S.A.), 2001 IEEE ISSCC Digest of Technical Papers, TA7.6

FIG. 16 is a schematic diagram showing the configuration of a memory cell having a magnetic tunnel junction (hereinafter, also simply referred to as "MTJ memory cell").

Referring to FIG. 16, an MTJ memory cell has a tunneling magneto-resistance element TMR in which electric resistance changes according to the level of stored data and an access element ATR for forming a path of a sense current Is passing through tunneling magneto-resistance element TMR when data is read. Since access element ATR is formed representatively by a field effect transistor, access element ATR will be also referred to as an access transistor ATR hereinafter. Access transistor ATR is connected between tunneling magneto-resistance element TMR and a fixed voltage (ground voltage Vss).

For the MTJ memory cell, a write word line WWL for instructing writing of data, a read word line RWL for reading data, and a bit line BL as a data line for transmitting an electric signal corresponding to the level of stored data in a data reading/writing operation are disposed.

FIG. 17 is a conceptual diagram for describing reading of data from the MTJ memory cell.

Referring to FIG. 17, tunneling magneto-resistance element TMR has a ferromagnetic layer (hereinafter, also simply referred to as "fixed magnetic layer") FL having a fixed predetermined magnetization direction and a ferromagnetic layer (hereinafter, also simply referred to as "free magnetic layer") VL magnetized in the direction according to a magnetic field applied from the outside. Between fixed magnetic layer FL and free magnetic layer VL, a tunneling barrier layer (tunnel film) TB made by an insulating film is provided. Free magnetic layer VL is magnetized in the same direction as fixed magnetic layer FL or in the direction opposite to fixed magnetic layer FL in accordance with the level of storage data to be written. By fixed magnetic layer FL, tunneling barrier TB, and free magnetic layer VL, a magnetic tunnel junction is formed.

At the time of reading data, in response to activation of read word line RWL, access transistor ATR is turned on. It enables sense current Is to be passed through a current path constructed by bit line BL, tunneling magneto-resistance element TMR, access transistor ATR, and ground voltage Vss.

Electric resistance of tunneling magneto-resistance element TMR changes according to the relative relation between the magnetization direction of fixed magnetic layer FL and the magnetization direction of free magnetic layer VL. Concretely, when the magnetization direction of fixed magnetic layer FL and that of free magnetic layer VL are the same (parallel), as compared with the case where the magnetization directions are opposite (anti-parallel) to each other, the electric resistance of tunneling magneto-resistance element TMR is lower.

Therefore, by magnetizing free magnetic layer VL in one of the two kinds of directions in accordance with storage data, a voltage change occurring in tunneling magneto-resistance element TMR by sense current Is varies according to the level of the storage data. For example, after precharging bit line BL to a predetermined voltage, sense current Is is passed to tunneling magneto-resistance element TMR, and by detecting the voltage of bit line BL, data stored in the MTJ memory cell can be read.

FIG. 18 is a conceptual diagram for describing an operation of writing data to the MTJ memory cell.

Referring to FIG. 18, at the time of writing data, read word line RWL is made inactive and access transistor ATR is turned off. In this state, a data write current for magnetizing free magnetic layer VL in the direction according to write data is passed to write word line WWL and bit line BL. The magnetization direction of free magnetic layer VL is determined by the data write current flowing in write word line WWL and the data write current flowing in bit line BL.

FIG. 19 is a conceptual diagram showing the relation between the data write current at the time of writing data to the MTJ memory cell and the magnetization direction of the tunneling magneto-resistance element.

Referring to FIG. 19, a horizontal axis H (EA) indicates a magnetic field applied in the direction of a magnetization easy axis (EA) in free magnetic layer VL in tunneling magneto-resistance element TMR. On the other hand, a vertical axis H (HA) indicates a magnetic field acting in the direction of a magnetization hard axis (HA) in free magnetic layer VL. The magnetic fields H (EA) and H (HA) correspond to two magnetic fields generated by the current passing through bit line BL and the current passing through write word line WWL.

In the MTJ memory cell, the fixed magnetization direction of fixed magnetic layer FL is along the magnetization easy axis of free magnetic layer VL, and free magnetic layer VL is magnetized in parallel with (in the same direction as)

or in anti-parallel (opposite) with fixed magnetic layer FL along the magnetization easy axis direction in accordance with the level of the stored data ("1" and "0"). In the specification, the electric resistance of tunneling magneto-resistance element TMR corresponding to the two kinds of magnetization directions of free magnetic layer VL is expressed by Rmax and Rmin (where Rmax>Rmin). The MTJ memory cell can store one-bit data ("1" or "0") in correspondence with the two kinds of magnetization directions of free magnetic layer VL.

The magnetization direction of free magnetic layer VL can be newly rewritten only in the case where the sum of magnetic fields H (EA) and H (HA) applied reaches the outside of the asteroid characteristic curve shown in the diagram. In other words, when the data write magnetic field applied has an intensity corresponding to the inside area of the asteroid, characteristic curve the magnetization direction of free magnetic layer VL does not change.

As shown by the asteroid characteristic curve, by applying a magnetic field in a magnetization hard axis direction to free magnetic layer VL, a magnetization threshold value necessary to change the magnetization direction along the magnetization easy axis can be decreased.

In the case where the operating point at the time of writing data is designed as shown in the example of FIG. 19, in an MTJ memory cell to which data is to be written, a data write magnetic field in the magnetization easy axis direction is designed so that its intensity becomes $H_{WR}$. Specifically, the value of a data write current passed to bit line BL or write word line WWL is designed so that data write magnetic field $H_{WR}$ is obtained. Generally, data write magnetic field $H_{WR}$ is expressed by the sum of a switching magnetic field Hsw necessary to switch the magnetization direction and a margin amount $\Delta H$ ($H_{WR}=H_{SW}+\Delta H$).

In order to rewrite data stored in the MTJ memory cell, that is, the magnetization direction of tunneling magneto-resistance element TMR, a data write current of a predetermined level or higher has to be passed to both of write word line WWL and bit line BL. By the data write current, free magnetic layer VL in tunneling magneto-resistance element TMR is magnetized in the direction parallel to or opposite (anti-parallel) to fixed magnetic layer FL in accordance with the direction of the data write magnetic field along magnetization easy axis (EA). The magnetization direction once rewritten in tunneling magneto-resistance element TMR, that is, the data stored in the MTJ memory cell is held in a nonvolatile manner until new data writing is executed.

A method of stably damaging a desired tunnel film which is generally as thin as a few nm in a tunneling magneto-resistance element TMR is disclosed in U.S. Pat. No. 6,324, 093. Concretely, a tunnel film in a tunneling magneto-resistance element TMR in an MTJ memory cell whose tunnel film is to be damaged (hereinafter, also referred to as "memory cell to be damaged") is damaged to irreversibly fix data stored in the MTJ memory cell, and the device is used as a ROM (Read-Only Memory). In the specification, irreversible fixing of data stored in an MTJ memory cell is also referred to as destructive writing.

Generally, in a memory device, normal operations such as data reading and data writing operations are executed on the basis of program information externally stored in a nonvolatile manner.

Typically, information used for controlling a redundancy configuration for repairing a defective memory cell by replacement with a spare memory cell is stored as program information. In the redundancy configuration, at least a defect address for specifying a defective memory cell has to be stored as program information.

In a conventional memory device (such as a DRAM (Dynamic Random-Access Memory)), the program information is programmed by disconnecting (blowing out) a fuse element with a laser beam or the like.

In an MRAM device as well, a configuration of performing programming by using a fuse element in order to store program information externally is considered.

However, in the configuration of making programming by blowing out a fuse element for replacing a defective memory cell, special equipment such as a trimmer dedicated to laser blowing is necessary. Consequently, time and cost consumed for the programming process increase.

Moreover, the programming process carried out by blowing out a fuse element is executed in a wafer state. Therefore, for example, in a memory device in which a defect address corresponding to a defective memory cell detected in a wafer state is programmed and which is packaged and formed as a product, it is difficult to deal with a defective memory cell which appears later, so that deterioration in the yield occurs.

SUMMARY OF THE INVENTION

An object of the present invention is to provide a thin film magnetic memory device to/from which program information can be efficiently and stably stored/read by using the small number of memory cells.

The present invention is summarized as follows. A thin film magnetic memory device includes: a memory array in which a plurality of memory cells each magnetically storing data are arranged in a matrix; and a program circuit for storing information used for at least one of an operation of reading data and an operation of writing data from/to the plurality of memory cells. The program circuit includes a plurality of program cells each for storing program data constructing the information, and each of the memory cells and the program cells includes a magnetic storing part having first and second electric resistances in correspondence with two magnetization directions respectively. The program circuit further includes: a driver circuit for irreversibly fixing electric resistance in the magnetic storing part in one of the plurality of program cells to a third electric resistance with physical destruction; and a sense driver circuit capable of sensing which one of the first and second electric resistances is provided for the magnetic storing part in one of the plurality of program cells in a first mode. The sense driver circuit can sense whether any one of the first or second electric resistances, or third electric resistance is provided for the magnetic storing part in one of the plurality of program cells in a second mode. The first electric resistance is larger than the second electric resistance, and the second electric resistance is larger than the third electric resistance.

Therefore, main advantages of the present invention are that program data can be stored on a bit unit basis, the electric resistance of the magnetic storing part in a selected program cell can be irreversibly fixed by physical destruction, and the electric resistance of the magnetic storing part can be determined in the first and second modes. In such a manner, the thin film magnetic memory device to/from which program data can be efficiently and stably stored/read by using the small number of memory cells can be realized.

According to another aspect of the present invention, there is provided a method of fabricating a thin film magnetic memory device including a plurality of memory cells each for magnetically storing data, including: a repair determining step of determining whether a device can be repaired or not on the basis of a result of a wafer test; a program fixing step which is executed after the repair determining step and irreversibly stores information for repairing the device obtained by the wafer test into a program circuit for the device which is determined to be repairable in the repair determining step; and an assembly step executed after the program fixing step. The program circuit includes a plurality of program cells each magnetically storing program data used for programming the information, each of the program cells in the program circuit has a magnetic storing part for storing data when being magnetized in one of two directions, and electric resistance of the magnetic storing part in each of the program cells in which the program data is stored is fixed by a physical destructive operation in the program fixing step. Therefore, a main advantage of the present invention is that by performing the program fixing step before the assembly step, data in the magnetic storing part can be prevented from being lost in the assembly step and subsequent steps.

According to further another aspect of the present invention, there is provided a method of fabricating a thin film magnetic memory device including a plurality of memory cells each for magnetically storing data, including: a repair determining step of determining whether a device can be repaired or not on the basis of a result of a wafer test; an assembly step executed for the device determined to be repairable in the repair determining step; and a program fixing step which is executed after the assembly step and irreversibly stores information for repairing the device obtained by the wafer test into a program circuit. The program circuit includes a plurality of program cells each magnetically storing program data used for programming the information, each of the program cells in the program circuit has a magnetic storing part for storing data when being magnetized in one of two directions, and electric resistance of the magnetic storing part in each of the program cells in which the program data is stored is fixed by a physical destructive operation in the program fixing step.

Therefore, an another advantage of the present invention is that, by performing the program fixing step after the assembly step, the possibility of repairing a defective which occurs in the assembly step or the like can be increased.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
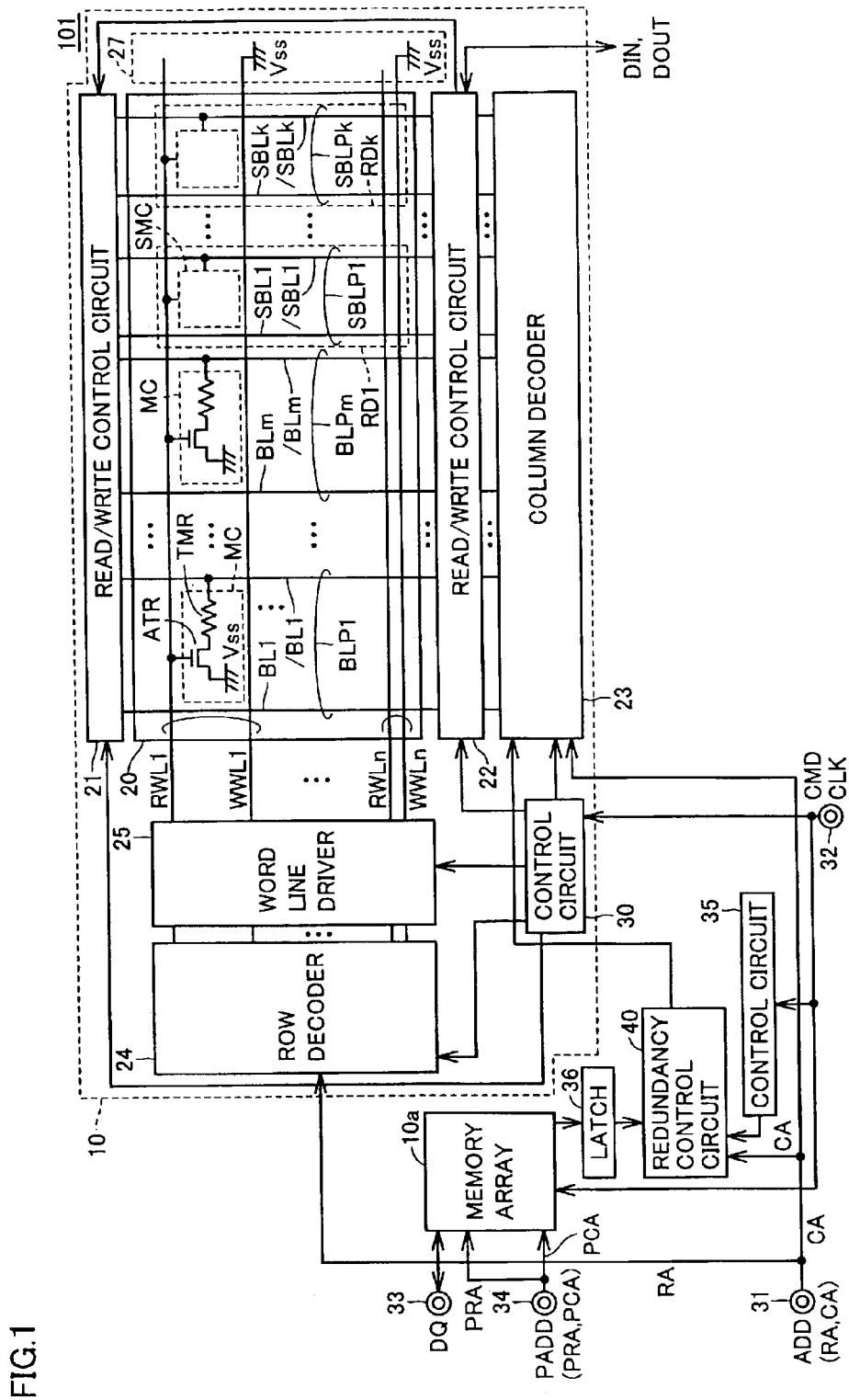
FIG. 1 is a diagram showing, as a study example, a configuration for storing program information of an MRAM device into another MRAM provided internally.

Embodiments of the present invention will be described below with reference to the drawings. The same reference numerals in the drawings indicate the same or corresponding components.

Study Example of Method of Programming Information into MRAM Device

First, as a study example, as a configuration of an MRAM device for efficiently storing program information, an MRAM device which is constructed by a plurality of MTJ memory cells and stores program information by using MTJ memory cells provided for a dedicated array different from a data storing array which can be accessed at random will be described.

Referring to FIG. 1, an MRAM device 101 of the study example executes a random access in accordance with a control signal CMD and an address signal ADD from the outside and receives write data DIN or outputs read data DOUT. The data reading operation and the data writing operation in MRAM device 101 are executed, for example, at timings synchronized with a clock signal CLK from the outside.

Alternately, an operation timing may be internally determined without receiving clock signal CLK from the outside.

MRAM device 101 includes an address terminal 31 for receiving address signal ADD, a control signal terminal 32 for receiving control signal CMD and clock signal CLK, and a memory array 10.

Memory array 10 includes a memory cell array 20 having a plurality of MTJ memory cells arranged in a matrix, a control circuit 30 for controlling the general operation of memory array 10 in response to control signal CMD and clock signal CLK, a row decoder 24, a column decoder 23, a word line driver 25, and read/write control circuits 21 and 22.

The configuration of memory cell array 20, which will be described in detail later, includes a plurality of normal MTJ memory cells (hereinafter, also referred to as "normal memory cells") arranged in a matrix and spare memory cells for repairing a normal memory cell which becomes defective (hereinafter, also referred to as "defective memory cell") each of which can be designated by address signal ADD.

A defect in a normal memory cell is repaired by replacement of a predetermined redundant repair section as a unit. A plurality of redundancy circuits each for replacing a redundant repair section including a defective memory cell are constructed by spare memory cell. Generally, redundant repair sections are set on the unit basis of a memory cell row, a memory cell column, or a data I/O line. In any of the cases, each redundancy circuit corresponds a spare block corresponding to a spare row, a spare column, or a spare I/O line respectively. As the details will be described later, in the embodiment, a defect in a normal memory cell is repaired on a memory cell column unit basis.

In correspondence with rows of MTJ memory cells (hereinafter, also simply referred to as "memory cell rows"), a plurality of read word lines RWL and write word lines WWL are disposed. In correspondence with columns of MTJ memory cells (hereinafter, also simply referred to as "memory cell columns"), bit lines BL and /BL are disposed.

Row decoder 24 selects a row in memory cell array 20 in accordance with a row address RA indicated by address signal ADD. Column decoder 23 selects a column in memory cell array 20 in accordance with a column address CA indicated by address signal ADD. Word line driver 25 selectively activates read word line RWL or write word line WWL on the basis of a result of the row selected by row decoder 24. By row address RA and column address CA, a memory cell (hereinafter, also referred to as "selected memory cell") designated as an object to/from which data is read/written is indicated.

Write word line WWL is connected to ground voltage Vss in an area 27 opposite to word line driver 25 over memory cell array 20. On the other hand, one end of read word line RWL is electrically open in area 27.

Read/write control circuits 21 and 22 are a generic name of a circuit group disposed in areas adjacent to memory cell array 20 in order to pass a data write current and a sense current (data read current) to bit lines BL and /BL of a selected memory cell column (hereinafter, also referred to as "selected column") corresponding to a selected memory cell in the data reading/writing operation.

MRAM device 101 further includes a data terminal 33, an address terminal 34, a memory array 10a, a latch circuit 36, a redundancy control circuit 40, and a control circuit 35.

Data terminal 33 is a terminal for receiving/transmitting data from/to memory array 10a. Address terminal 34 receives an address signal PADD independent of address signal ADD and outputs a row address PRA and a column address PCA to memory array 10a.

As will be described in detail later, memory array 10a has a configuration similar to that of memory array 10. Memory array 10a stores program information used at least one of the data reading operation and the data writing operation in a nonvolatile manner. That is, memory array 10a operates as a program circuit for storing program information.

Further, in memory array 10a, when program data is written, a defect address for specifying a defective memory cell in memory cell array 20 constructing program information inputted from data terminal 33 (hereinafter, also simply referred to as "defect address") is stored into a memory cell of an address designated by address signal PADD inputted from address terminal 34.

In an activation initial operation of MRAM device 101, memory array 10a reads out the stored defect address by address signal PADD and outputs it to latch circuit 36.

In the study example, the configuration in which a defect address is stored as program information into memory array 10a will be described representatively. The defect address corresponds to a column address indicative of a memory cell column in which a defective memory cell exists (hereinafter, also referred to as "defective column").

Latch circuit 36 temporarily stores the defect address inputted from memory array 10a.

In a normal operation, redundant control circuit 40 compares column address CA with the defect address held in latch circuit 36, thereby determining whether the defective column is selected as an object of data reading or data writing.

When it is determined that the defective column is selected by column address CA, redundancy control circuit 40 instructs column decoder 23 to access a redundancy circuit constructed by spare memory cells and to stop accessing a memory cell column indicated by column address CA.

Consequently, data is read or written from/to the redundancy circuit in place of the memory cell column indicated by column address CA.

On the other hand, when column address CA does not coincide with a defect address, a normal column selecting operation is executed by column decoder 23, a memory cell column indicated by column address CA is selected and the data reading/writing operation is executed.

Control circuit 35 activates redundancy control circuit 40 by control signal CMD.

The configuration of memory cell array 20 will now be described in detail. Memory cell array 20 has normal memory cells MC arranged in "n" rows and "m" columns (n, m: natural numbers) and k pieces (k: natural number) of redundancy circuits RD1 to RDk. In the embodiment, repairing by replacement is executed on the memory cell column unit basis, so that each of redundancy circuits RD1 to RDk corresponds to a spare column. In the following, redundancy circuits RD1 to RDk will be also generically referred to as redundancy circuit RD.

In memory cell array 20 as a whole, MTJ memory cells having a similar configuration are arranged in "n" memory cell rows and (m+k) memory cell columns. In the following, the memory cell column of normal memory cells will be also referred to as a "normal memory cell column" and a spare memory cell column corresponding to each of redundancy circuits RD1 to RDk will be also referred to as a "spare column".

In correspondence with the memory cell rows respectively, read word lines RWL1 to RWLn and write word lines WWL1 to WWLn are disposed.

In correspondence with the normal memory cell columns respectively, bit line pairs BLP1 to BLPm are disposed. Each bit line pair consists of two complementary bit lines. For example, bit line pair BLP1 consists of bit lines BL1 and /BL1.

In correspondence with the spare memory cell columns respectively, spare bit line pairs SBLP1 to SBLPk are disposed. In a manner similar to the bit line pair, each spare bit line pair consists of two complementary bit lines. For example, spare bit line pair SBLP1 consists of spare bit lines SBL1 and /SBL1.

In the following, in the case of generically expressing the write word line, read word line, bit line pair, bit line, spare bit line pair, and spare bit line, they will be referred to by using reference characters WWL, RWL, BLP, BL (/BL), SBLP and SBL (/SBL), respectively. In the case of indicating specific write word line, read word line, bit line pair, bit line, spare bit line pair, and spare bit line, they will be referred to by adding a numerical subscript to the reference characters like WWL1, RWL1, BLP1, BL1 (/BL1), SBLP1 and SBL1 (/SBL1), respectively. A high voltage state (power source voltage Vcc) and a low voltage state (ground voltage Vss) of a signal and a signal line will be also referred to as an "H level" and an "L level", respectively.

Each of normal memory cell MC and spare memory cell SMC has tunneling magneto-resistance element TMR acting as a magnetic storing part in which electric resistance changes according to the level of stored data and access transistor ATR acting as an access gate, which are connected in series. As already described above, as access transistor ATR, a MOS transistor as a field effect transistor formed on a semiconductor substrate is representatively applied. Tunneling magneto-resistance element TMR is magnetized in one of the two magnetization directions and its electric resistance is set to Rmin or Rmax. In the following the difference between the electric resistance values (Rmax–Rmin) is described as $\Delta R$.

Normal memory cell MC is connected to one of bit lines BL and /BL every other row. For example, normal memory cells belonging to the first memory cell column will be described. The normal memory cell in the first row is connected to bit line /BL1, the normal memory cell in the second row is connected to bit line BL1, although not shown, similarly, each of normal memory cells and spare memory cells is connected to one of bit lines /BL1 to /BLm each of which is one of bit lines in a pair in odd-numbered rows and connected to bit lines BL1 to BLm in even-numbered rows. Similarly, spare memory cells SMC are connected to spare bit lines /SBL1 to /SBLk in odd-numbered rows and connected to spare bit lines SBL1 to SBLk in even-numbered rows.

Figure 2:
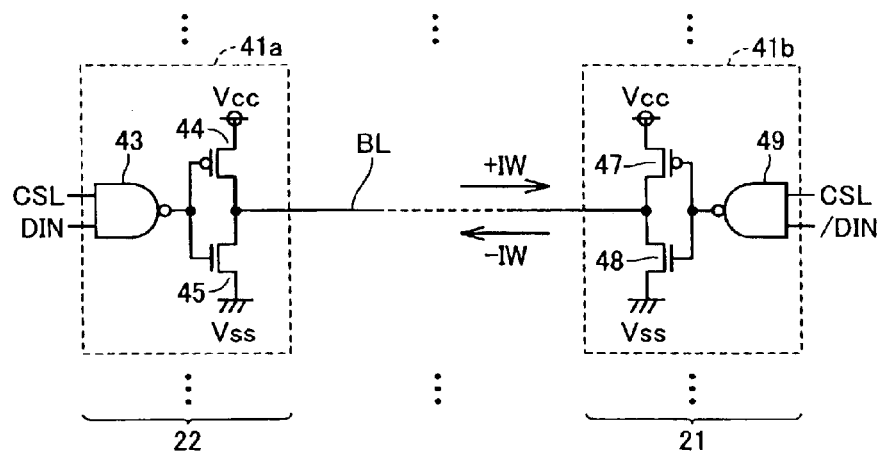
FIG. 2 is a circuit diagram showing the configuration of a write driver for passing a data write current to a bit line in a selected column.

FIG. 2 is a circuit diagram showing the configuration of a write driver for passing a data write current to bit line BL of a selected column. FIG. 2 shows only the configuration corresponding to the writing of data to the MTJ memory cell. At the time of reading, all of bit lines BL are set to a floating state by a write driver (not shown) of another configuration.

Referring to FIG. 2, read/write control circuit 22 has a write driver 41a provided on one end side of bit line BL. Read/write control circuit 21 has a write driver 41b provided on the other end side of bit line BL. FIG. 2 shows that write drivers 41a and 41b corresponding to one bit line BL are disposed. In practice, similar write drivers are provided in correspondence with bit lines of memory cell columns.

Write driver 41a has a NAND gate 43 receiving a column selection signal CSL indicative of a result of column selection in a corresponding memory cell column and write data DIN, a P-channel MOS transistor 44 connected between one end of corresponding bit line BL and power source voltage Vcc, and an N-channel MOS transistor 45 electrically connected between one end of corresponding bit line BL and ground voltage Vss.

An output of NAND gate 43 is supplied to the gate of each of transistors 44 and 45. That is, transistors 44 and 45 operate as an inverter for driving one end of bit line BL in accordance with the level of write data DIN in the selected column.

Write driver 41b has an NAND gate 49 receiving a column selection signal CSL indicative of a result of column selection in a corresponding memory cell column and an inversion signal /DIN of the write data, a P-channel MOS transistor 47 connected between the other end of corresponding bit line BL and power source voltage Vcc, and an N-channel MOS transistor 48 electrically connected between the other end of corresponding bit line BL and ground voltage Vss.

An output of NAND gate 49 is supplied to the gate of each of transistors 47 and 48. That is, transistors 47 and 48 operate as an inverter for driving the other end of bit line BL in accordance with the inversion level of write data DIN in the selected column. As the drive voltage of write drivers 41a and 41b, a voltage other than ground voltage Vss and power source voltage Vcc can be also used.

In a column which is not selected, an output of each of NAND gates 43 and 49 is set to the H level. Therefore, both ends of bit line BL of the not-selected column are connected to ground voltage Vss. On the other hand, in a selected column, one of outputs of NAND gates 43 and 49 is connected to the H level and the other output is connected to the L level in accordance with the level of write data DIN. Consequently, both ends of bit line BL of the selected column are connected to power source voltage Vcc and ground voltage Vss in accordance with the level of write data DIN respectively.

As a result, to bit line BL of the selected column, according to the level of write data DIN, either a data write current +Iw flowing in the direction from write driver 41a toward write driver 41b or a data write current –Iw flowing in the direction from write driver 41b to write driver 41a is passed. In other words, data write current ±Iw passed to bit line BL of a selected column is set according to the level of write data DIN.

In tunneling magneto-resistance element TMR in which the data write current is passed to both of corresponding write word line WWL and bit line BL, write data according to the direction of data write current ±Iw is magnetically written.

Figure 3:
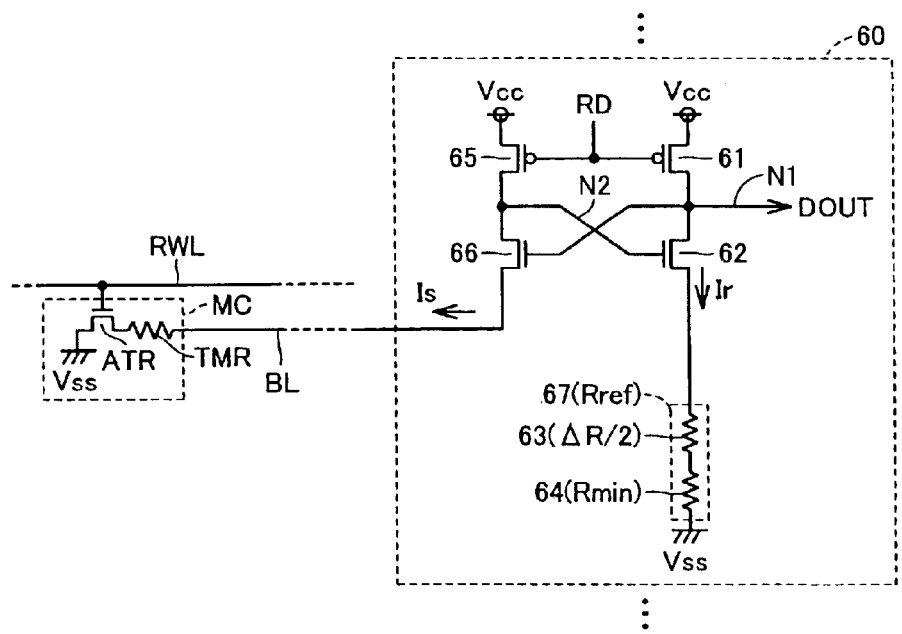
FIG. 3 is a circuit diagram showing the configuration of a current sense amplifier.

Referring to FIG. 3, read/write control circuit 22 further has a current sense amplifier 60 for setting data output signal DOUT to the H or L level in accordance with an amount of current flowing in bit line BL in the selected column. Current sense amplifier 60 is provided in correspondence with one end side of bit line BL. In FIG. 3, current sense amplifier 60 corresponding to one bit line BL is shown. In practice, similar current sense amplifiers are provided in correspondence with bit lines of memory cell columns. In FIG. 3, as an example, selected memory cell MC and sense amplifier 60 are electrically connected to each other via bit line BL. It is assumed that an H-level voltage is applied to the gate of access transistor ATR in selected memory cell MC, and tunneling magneto-resistance element TMR is electrically connected to the drain of access transistor ATR.

Current sense amplifier 60 has a P-channel MOS transistor 65 and an N-channel MOS transistor 66 which are connected in series between power source voltage Vcc and bit line BL, and a P-channel MOS transistor 61, an N-channel MOS transistor 62, and a reference resistor 67 which are connected in series between power source voltage Vcc and ground voltage Vss.

Reference resistor 67 has resistors 63 and 64 connected in series. Electric resistance Rref of reference resistor 67 is set to an intermediate value of Rim and Rmax, preferably, to Ref=Rmin+$\Delta R$/2. Therefore, the resistance value of resistor 63 is set to $\Delta R$/2 and the resistance value of resistor 64 is set to Rmin.

To the gates of P-channel MOS transistors 65 and 61, a control signal RD from control circuit 30 is inputted. The gate of N-channel MOS transistor 66 is connected to a node N1 corresponding to a connection node of P-channel MOS transistor 61 and N-channel MOS transistor 62. The gate of N-channel MOS transistor 62 is connected to a node N2 corresponding to a connection node of P-channel MOS transistor 65 and N-channel MOS transistor 66.

The operation of current sense amplifier 60 at the time of reading data stored in selected memory cell MC will now be described. When control signal RD of the L level is inputted, by P-channel MOS transistors 65 and 61 in current sense amplifier 60, connection nodes N2 and N1 are electrically coupled to power source voltage Vcc. Therefore, the voltage of each of nodes N2 and N1 is set to Vcc. When control signal RD of the L level is inputted, P-channel MOS transistors 65 and 61 operate as a current source. When the voltage of nodes N1 and N2 becomes Vcc, by the operation of N-channel MOS transistors 66 and 62, nodes N2 and N1, are electrically coupled to bit line BL and reference resistor 67 respectively.

At this time, sense current Is is passed to bit line BL and a reference current Ir is passed to reference resistor 67.

First, the operation in the case where the resistance value of tunneling magneto-resistance element TMR in selected memory cell MC is Rmin will be described. In this case, the relation of Is>Ir is satisfied, so that the potential of node N2 drops and N-channel MOS transistor 62 disconnects node N1 and reference resistor 67. Therefore, the voltage of node N1 becomes Vcc and output signal DOUT becomes the high level.

Next, the operation in the case where the resistance value of tunneling magneto-resistance element TMR is Rmax will be described. In this case, the relation of Is<Ir is satisfied, so that the potential of node N1 drops and N-channel MOS transistor 66 electrically disconnects node N2 and bit line BL. Finally, the voltage of node N1 becomes almost 0 V and output signal DOUT becomes the low level. By the operations as described above, current sense amplifier 60 can detect data stored in the selected memory cell.

Figure 4:
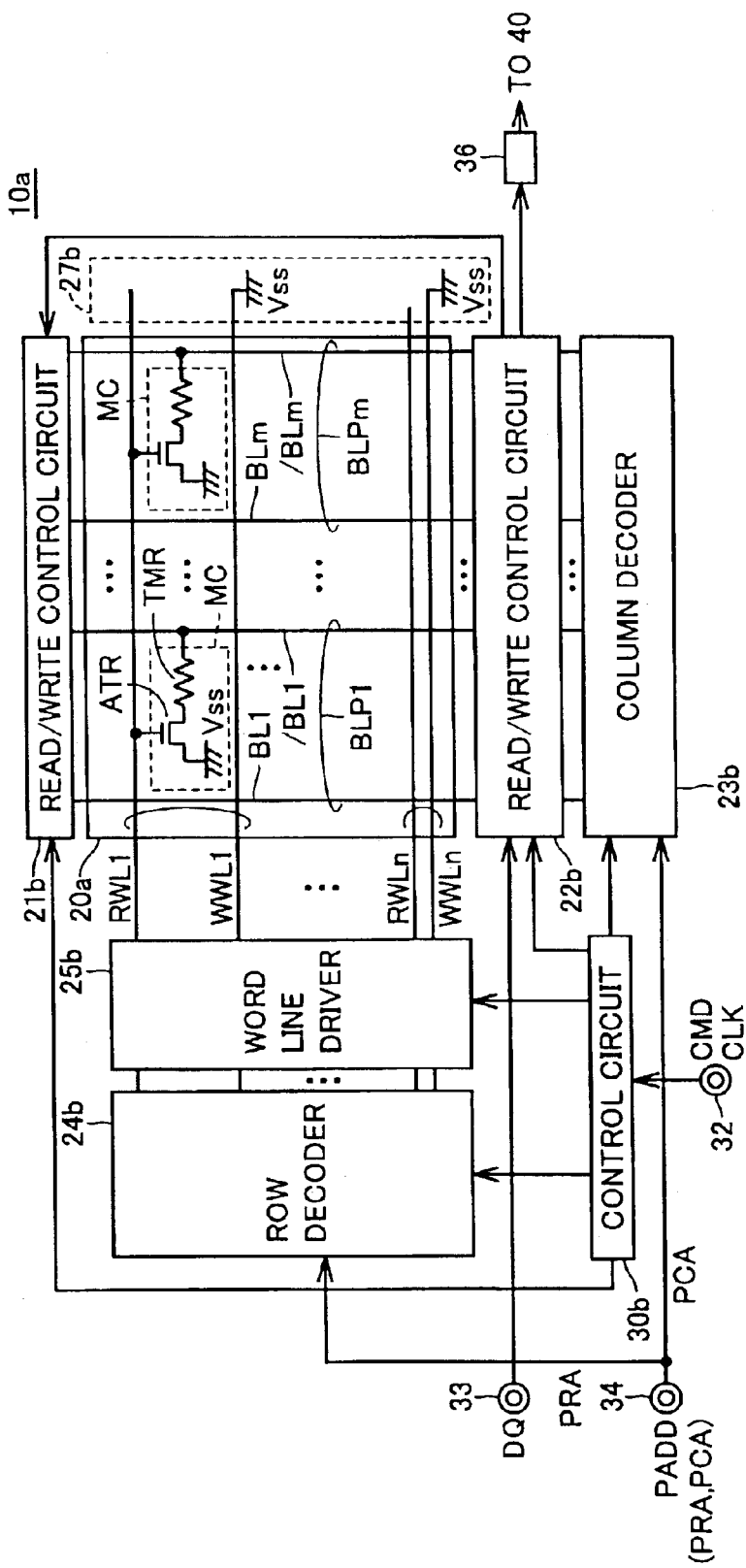
FIG. 4 is a detailed internal configuration diagram of a memory array.

Referring to FIG. 4, memory array 10a is different from memory array 10 of MRAM device 101 in FIG. 1 with respect to a point that a memory cell array 20a is included in place of memory cell array 20, a point that read/write control circuits 21b and 22b are included in place of read/write control circuits 21 and 22, a point that a column decoder 23b is included in place of column decoder 23, a point that a row decoder 24b is included in place of row decoder 24, a point that a word line driver 25b is included in place of word line driver 25, and a point that a control circuit 30b is included in place of control circuit 30.

Moreover, memory array 10a is different from memory array 10 with respect to a point that in place of row signal RA from address terminal 31, row signal PRA from address terminal 34 is inputted to row decoder 24b, and a point that in place of column signal CA from address terminal 31, column signal PCA from address terminal 34 is inputted to column decoder 23b.

Further, memory array 10a is different from memory array 10 of MRAM device 101 in FIG. 1 with respect to a point that a signal from redundant control circuit 40 is not inputted to column decoder 23b, a point that data signal DQ is inputted from data terminal 33 to read/write control circuit 22b, and a point that in place of inputting signal DIN to read/write control circuit 22 and outputting signal DOUT from read/write control circuit 22, read data is outputted from read/write control circuit 22b to latch circuit 36.

Memory cell array 20a is different from memory cell array 20 with respect to the point that memory cell array 20a does not have redundancy circuit RD. Since the other configuration is similar to memory array 10 in MRAM device 101 in FIG. 1, detailed description will not be repeated. In memory array 20a, in a manner similar to memory array 20, write word line WWL is connected to ground voltage Vss in an area 27b opposite to a word line driver 25a over memory cell array 20a. On the other hand, one end of read word line RWL is electrically open in area 27b.

Since read/write control circuits 21b and 22b, column decoder 23b, row decoder 24b, word line driver 25b, and control circuit 30b have the same functions as read/write control circuits 21 and 22, column decoder 23, row decoder 24, word line driver 25, and control circuit 30 respectively, the detailed description will not be repeated.

Generally, when it is assumed that the capacity of the memory cell array in memory array 10 is 1 Mbits, memory array 10a for storing a defect address has a small capacity of, for example, 5 kbits.

The operation for storing a defect address into memory cell array 20a will now be described. First, control signal CMD is inputted to control circuit 30b and memory array 10a becomes writable. Row signal PRA and column signal PCA are inputted from address terminal 34 to row decoder 24b and column decoder 23b, respectively, and a desired memory cell in memory cell array 20a is selected. A defect address is inputted from data terminal 33 and stored into a desired memory cell.

For example, when the defect address consists of 10 bits, ten memory cells in the same row and different columns are sequentially selected by row signal PRA1 and successive column signals PCA1 to PCA10 and information of 10 bits is stored into the ten memory cells. When there are a plurality of defect addresses, the addresses are designated so that information is successively stored from a memory cell in the same row as the immediately preceding defect address and in the following column.

After all of data is stored into the memory cells in one row, the next defect address is stored in another row.

As a result, each of the memory cells in memory cell array 20a can store 1-bit data of a defect address without waste.

All of defect addresses stored in memory cell array 20a are outputted to latch circuit 36 in the activation initial operation of MRAM device 101.

The operation of memory array 10a at this time will be described. First, control signal CMD is inputted to control circuit 30b and memory array 10a becomes readable. The addresses of all of memory cells in which the defect addresses of memory cell array 20a are stored are sequentially designated by row signals PRA and column signals PCA, and all of defect address data is outputted to latch circuit 36 by read/write control circuit 22b.

Referring again to FIG. 1, a repairing operation by replacement in MRAM device 101 will be described. It is assumed that a defect address in memory cell array 20 is already stored in latch circuit 36 at the time of initial setting of MRAM device 101.

First, a data writing operation will be described. In the data writing operation, control signal CMD is inputted to control circuit 35. Control circuit 35 activates redundancy control circuit 40 in response to control signal CMD. Redundancy control circuit 40 compares a column address CA with the defect address stored in latch circuit 36 and determines whether a defective column is selected or not.

When a defective column is selected, redundant control circuit 40 instructs column decoder 23 to access redundancy circuit RD corresponding to column address CA and instructs to stop accessing a memory cell column indicated by column address CA. When address signal RA is inputted to row decoder 24, data is written into a memory cell of a desired row address in a redundancy circuit in place of the memory cell column indicated by column address CA.

On the other hand, when column address CA does not coincide with the defect address stored in latch circuit 36, a normal column selecting operation is executed by column decoder 23 and data is written into a memory cell of an address selected by the selected column and address signal RA.

Since repair by replacement in the data reading operation is executed on the basis of replacement of a defective column in a manner similar to that in the data writing operation, the detailed description will not be repeated.

As described above, in the configuration where the defective memory cell in the MRAM device can be repaired by being replaced with a normal memory cell, program information can be stored in a nonvolatile manner into the memory device for storing a defect address. By internally separately providing and using the data-rewritable MRAM array, unlike a conventional memory device using a fuse element, special equipment such as a trimmer dedicated to laser blowing becomes unnecessary.

In the configuration of the MRAM device of the study example, even when a defect is found in a product in a shipping test after an assembly process, program information can be rewritten by re-programming. Consequently, a defective after a shipping test can be repaired.

First Embodiment

However, when a strong magnetic field is applied to an MTJ memory cell, it is feared that stored data disappears. There is consequently a problem from the viewpoint of stable data storage of program information by using an MTJ memory cell. In other words, in the MRAM device of the study example, there is a danger that stability of operations deteriorates due to application of a magnetic field after programming.

Figure 5:
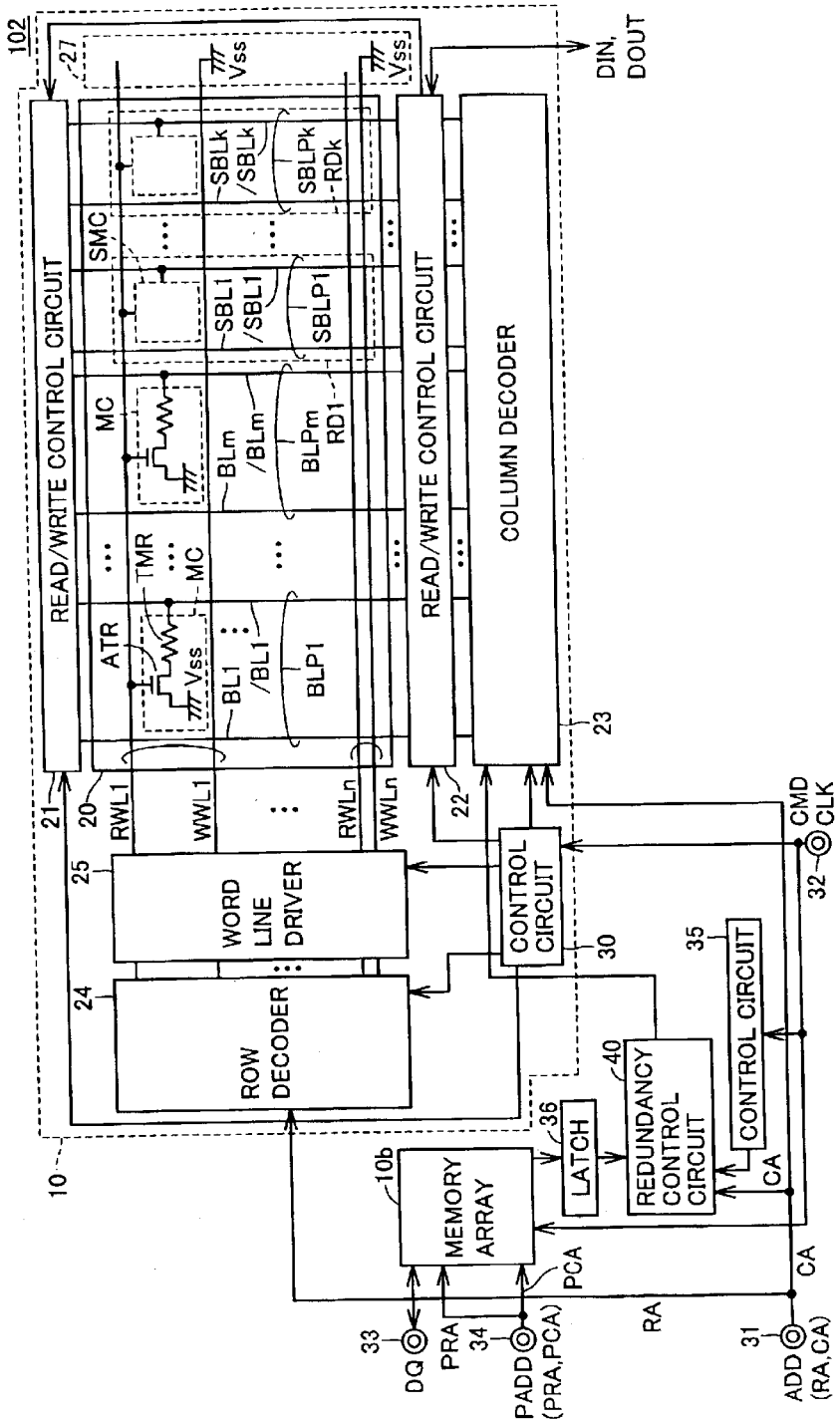
FIG. 5 is a configuration diagram of an MRAM device according to a first embodiment of the present invention.

Referring to FIG. 5, an MRAM device 102 is different from MRAM device 101 of FIG. 1 with respect to the point that a memory array 10b is provided in place of memory array 10a. Since the other configuration is the same as that of MRAM device 101 shown in FIG. 1, its detailed description will not be repeated. Memory array 10b operates as a program circuit for storing program information in a manner similar to memory array 10a.

Figure 6:
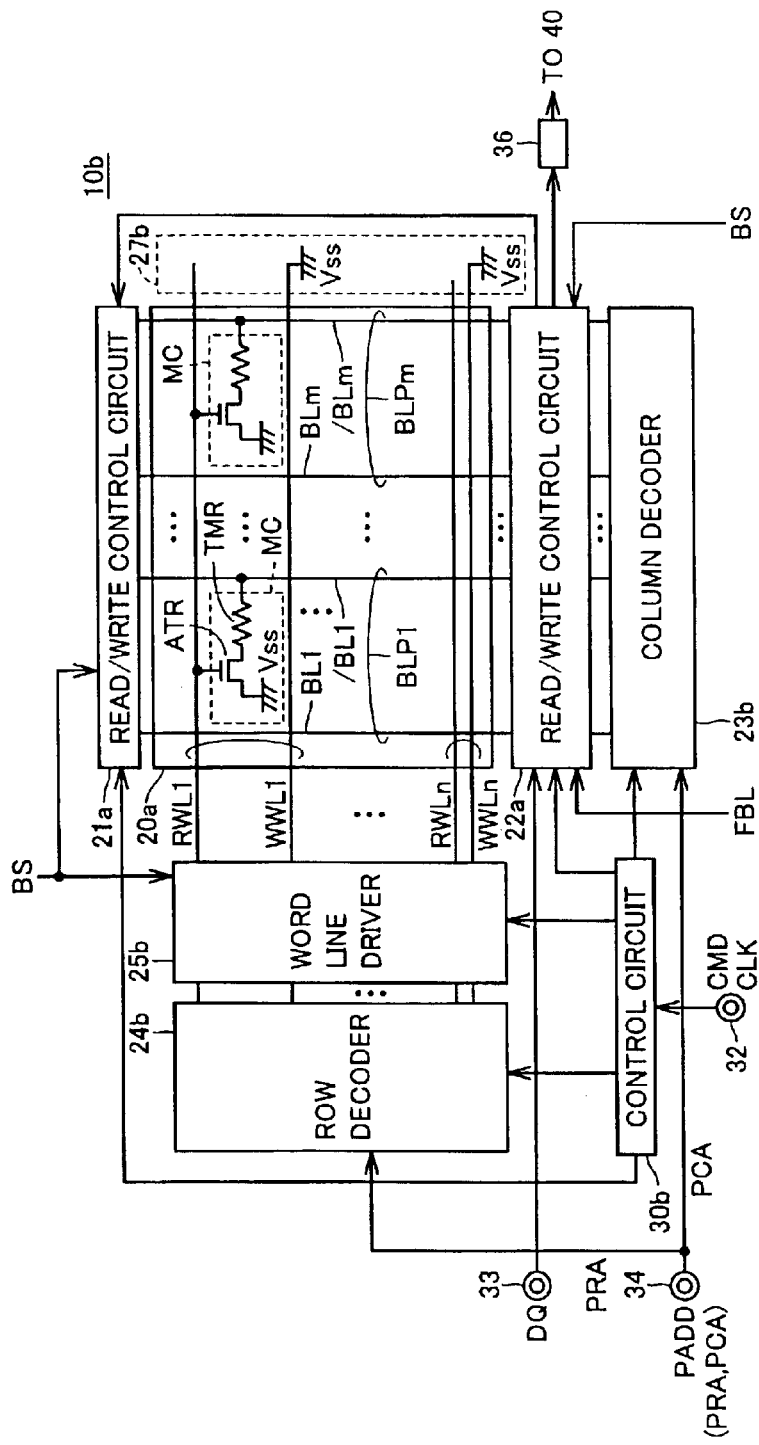
FIG. 6 is a detailed internal configuration diagram of a memory array.

Referring to FIG. 6, memory array 10b is different from memory array 10a with respect to a point that read/write control circuits 21a and 22a are included in place of read/write control circuits 21b and 22b, a point that a destructive write signal BS for destroying a tunnel film in tunneling magneto-resistance element TMR in an MTJ memory cell is inputted to each of read/write control circuits 21a and 22a and word line driver 25, and a point that a signal FBL is inputted to read/write control circuit 22a. Since the other configuration is the same as that of memory array 10a, its detailed description will not be repeated.

Read/write control circuits 21a and 22a have the function of passing write current ±Iw to the bit lines in memory cell array 20a at the time of writing data and, in addition, can apply a voltage higher than power source voltage Vcc by which the tunnel film in tunneling magneto-resistance element TMR can be destroyed (hereinafter, also referred to as a destructive write voltage).

Figure 7:
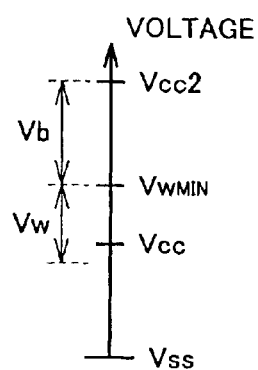
FIG. 7 is a diagram showing the relation between a power source voltage Vcc and a destructive write voltage Vb.

Referring to FIG. 7, power source voltage Vcc is a voltage applied to bit line BL and read word line RWL at the time of reading data from a memory cell or writing data to a memory cell. A voltage Vwmin is larger than power source voltage Vcc and is the minimum voltage by which tunneling magneto-resistance element TMR can be destroyed. Voltage Vw is smaller than voltage Vwmin and a voltage applied to a desired bit line and read word line RWL at the time of destructive writing. A destructive write voltage Vb is preferably about twice as large as voltage Vw in order to stably destroy a specific tunneling magneto-resistance element TMR. A voltage Vcc2 is the maximum destructive write voltage Vb. In the following specification, voltage sources capable of supplying voltages Vw and Vb will be also referred to as power source voltages Vw and Vb, respectively.

Figure 8:
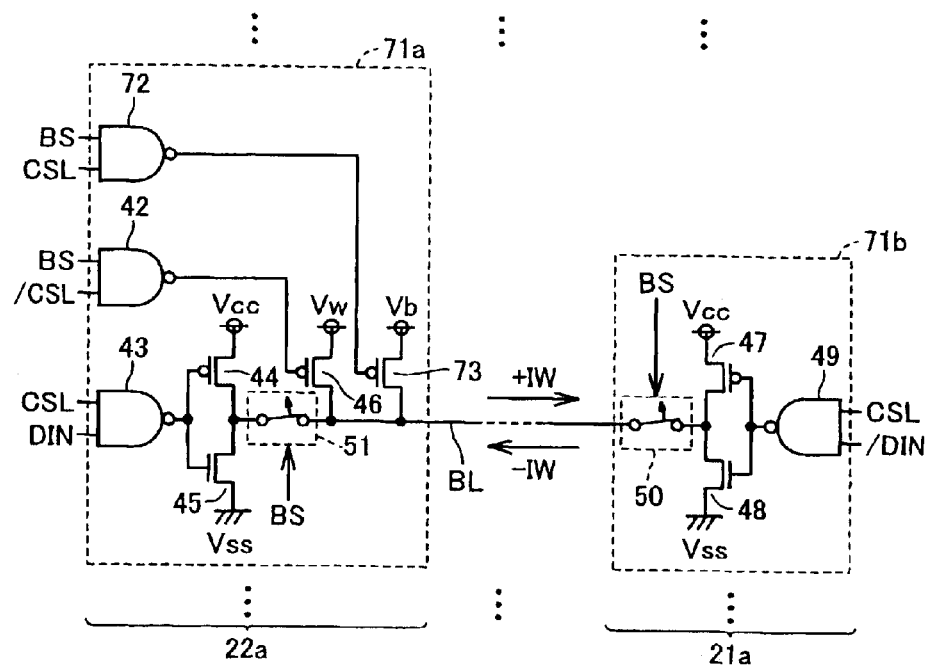
FIGS. 8 and 9 are circuit diagrams each showing the configuration of a driver according to the first embodiment.

FIG. 8 is a circuit diagram showing the configuration of drivers according to the first embodiment. FIG. 8 shows only the configuration corresponding to writing of data to an MTJ memory cell and the destructive writing. At the time of reading, all of bit lines BL are floated by a write driver (not shown) of another configuration.

Referring to FIG. 8, read/write control circuit 22a has a driver 71a provided on one end side of bit line BL and capable of realizing both a normal writing operation and a stable destructive writing operation. Read/write control circuit 21a has a driver 71b provided on the other end side of bit line BL. Although FIG. 8 shows arrangement of drivers 71a and 71b corresponding to one bit line BL, in practice, similar drivers are provided in correspondence with bit lines of memory cell columns.

Driver 71a is different from write driver 41a in FIG. 2 with respect to the point that NAND gates 42 and 72, P-channel MOS transistors 46 and 73, and a switch 51 are further included. Since the other configuration is similar to that of write driver 41a, the detailed description will not be repeated. NAND gate 42 receives inversion signal /CSL of column selection signal CSL indicative of a result of column selection in a corresponding memory cell column and a destructive write signal BS. NAND gate 72 receives column selection signal CSL indicative of a result of column selection in a corresponding memory cell column and destructive write signal BS.

P-channel MOS transistor 46 is connected between one end of corresponding bit line BL and power source voltage Vw, and P-channel MOS transistor 73 is connected between one end of corresponding bit line BL and power source voltage Vb. To the gates of transistors 46 and 73, outputs of NAND gates 42 and 72 are supplied respectively. Switch 51 is provided between one end of corresponding bit line BL and a connection node of P-channel MOS transistor 44 and N-channel MOS transistor 45.

Switch 51 electrically connects bit line BL and the connection node between P-channel MOS transistor 44 and N-channel MOS transistor 45 when destructive write signal BS is at the L level and does not electrically connect bit line BL and the connection node between P-channel MOS transistor 44 and N-channel MOS transistor 45 when destructive write signal BS is at the H level.

Driver 71b is different from write driver 41b in FIG. 2 with respect to the point that a switch 50 is further included. Since the other configuration is similar to that of write driver 41b, the detailed description will not be repeated. Switch 50 is provided between one end of corresponding bit line BL and the connection node between P-channel MOS transistor 47 and N-channel MOS transistor 48.

Switch 50 electrically connects bit line BL and the connection node between P-channel MOS transistor 47 and N-channel MOS transistor 48 when destructive write signal BS is at the L level, and does not electrically connect bit line BL and the connection node between P-channel MOS transistor 47 and N-channel MOS transistor 48 when destructive write signal BS is at the H level.

The operation of drivers 71a and 71b will now be described. Since the operation for passing data write current ±Iw when destructive write signal BS is at the L level is similar to the operation of write drivers 41a and 41b in FIG. 2, the detailed description will not be repeated.

The operation of drivers 71a and 71b when destructive write signal BS is at the H level will now be described. In a column which is not selected, outputs of NAND gates 42 and 72 are set to the L and H levels, respectively. Switch 50 electrically disconnects the connection node between P-channel MOS transistor 47 and N-channel MOS transistor 48 and bit line BL, and switch 51 electrically disconnects the connection node between P-channel MOS transistor 44 and N-channel MOS transistor 45 and bit line BL. Consequently, the voltage of bit line BL in a not-selected column becomes Vw.

In contrast, in a selected column, outputs of NAND gates 42 and 72 are set to the H and L levels, respectively. Switches 50 and 51 perform an operation similar to that in a not-selected column, so that the voltage of bit line BL in a selected column becomes Vb.

The operation of drivers 71a and 71b when destructive write signal BS is at the L level will now be described. In a not-selected column, outputs of NAND gates 42 and 72 are at the H level. In a selected column, outputs of NAND gates 42 and 72 are at the H level. Therefore, drivers 71a and 71b perform similar operations as those of write drivers 41a and 41b in FIG. 2, so that detailed description will not be repeated.

Figure 9:
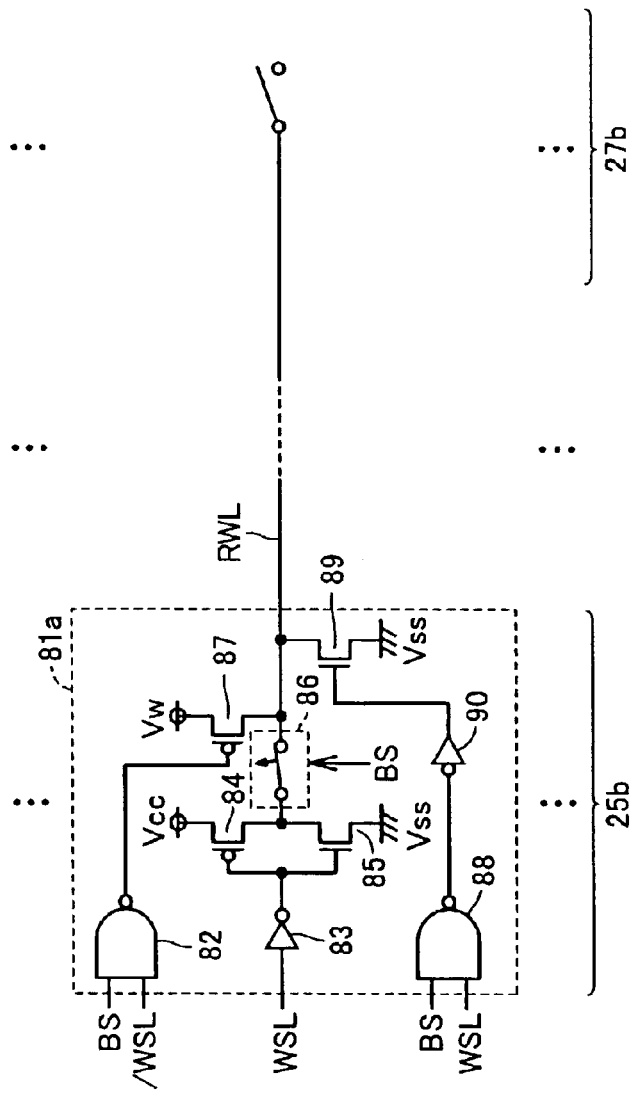

Referring to FIG. 9, word line driver 25b has a driver 81a provided on one end side of read word line RWL and capable of executing both a normal word line selecting operation and a stable destructive writing operation. The other end of read word line RWL is electrically open in area 27b. Although arrangement of driver 81a corresponding to one read word line RWL is shown in FIG. 9, in practice, similar drivers are provided in correspondence with read word lines RWL in memory cell rows.

Driver 81a has NAND gates 82 and 88, an inverter 83, P-channel MOS transistors 84 and 87, N-channel MOS transistors 85 and 89, a switch 86, and an inverter 90.

NAND gate 82 receives destructive write signal BS and an inversion signal /WSL of row selection signal WSL indicative of a result of row selection in a corresponding memory cell row. Inverter 83 outputs the inversion level of row selection signal WSL. NAND gate 88 receives both destructive write signal BS and row selection signal WSL.

P-channel MOS transistor 84 and N-channel MOS transistor 85 are provided in series between power source voltage Vcc and ground voltage Vss. To the gates of P-channel MOS transistor 84 and N-channel MOS transistor 85, an output of inverter 83 is inputted. Switch 86 is provided between the connection node of P-channel MOS transistor 84 and N-channel MOS transistor 85 and one end of corresponding word line RWL.

P-channel MOS transistor 87 is provided between power source voltage Vw and one end of corresponding read word line RWL. N-channel MOS transistor 89 is provided between one end of corresponding read word line RWL and ground voltage Vss. To the gate of P-channel MOS transistor 87, an output of NAND gate 82 is inputted. To the gate of N-channel MOS transistor 89, an output of the inverted level of NAND gate 88 is inputted.

Switch 86 electrically connects read word line RWL and the connection node between P-channel MOS transistor 44 and N-channel MOS transistor 45 when destructive write signal BS is at the L level and electrically disconnects read word line RWL and the connection node between P-channel MOS transistor 44 and N-channel MOS transistor 45 when destructive write signal BS is at the H level.

The operation of driver 81a when destructive write signal BS is at the L level will now be described. In a not-selected row, outputs of NAND gates 82 and 88 are at the H level. According to the operations of inverter 83 and N-channel MOS transistor 85, the voltage of read word line RWL is set to Vss. In a selected row, outputs of NAND gates 82 and 88 are at the H level. Since signal WSL is at the H level, according to the operation of inverter 83 and P-channel MOS transistor 84, the voltage of read word line RWL is set to Vcc.

The operation of driver 81a when destructive write signal BS is at the H level will now be described. In a not-selected row, outputs of NAND gates 82 and 88 are set to the L and H levels, respectively. Therefore, P-channel MOS transistor 87 electrically connects power source voltage Vw and read word line RWL. Switch 86 electrically disconnects read word line RWL and the connection node between P-channel MOS transistor 84 and N-channel MOS transistor 85, so that the voltage of read word line RWL in a selected row becomes Vw.

In contrast, in a selected row, outputs of NAND gates 82 and 88 are set to the H and L levels, respectively. Switch 86 electrically disconnects read word line RWL and the connection node between P-channel MOS transistor 84 and N-channel MOS transistor 85. Therefore, N-channel MOS transistor 89 sets read word line RWL to ground voltage Vss. That is, the voltage of read word line RWL in a not-selected row becomes Vss.

Figure 10:
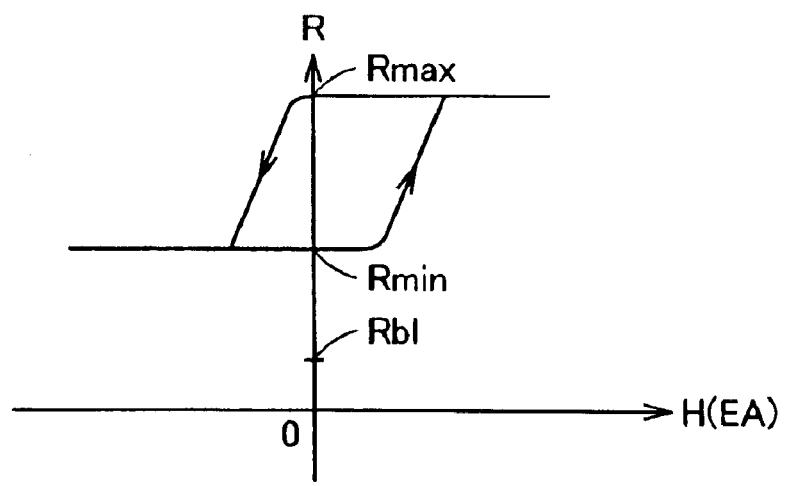
FIG. 10 is a diagram showing an electric resistance characteristic of an MTJ memory cell before destructive writing.

Referring to FIG. 10, as already described, the electric resistance of an MTJ memory cell is inverted when a magnetic field exceeding a threshold necessary for inverting the magnetization direction of the free magnetic layer is applied in the magnetic field easy axis direction EA and is set to either Rmax or Rmin.

Figure 11:
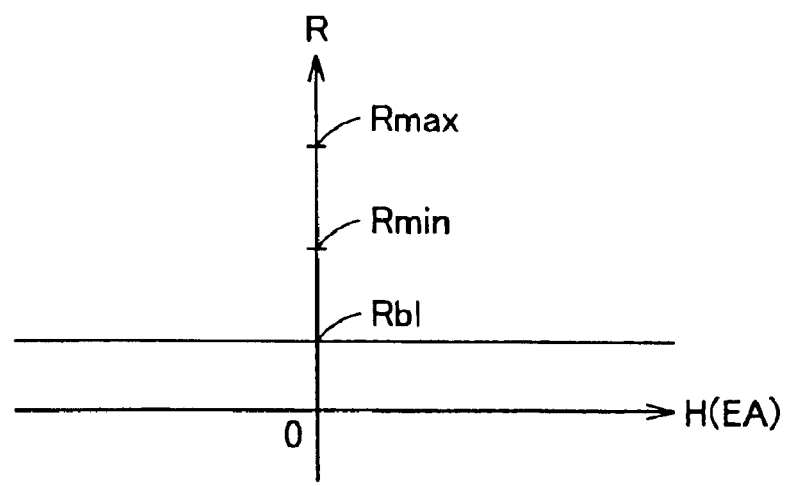
FIG. 11 is a diagram showing the electric resistance characteristic of the MTJ memory cell after the destructive writing.

Referring to FIG. 11, the electric resistance of the MTJ memory cell after destructive writing is fixed to Rbl lower than Rmax and Rmin.

Figure 12:
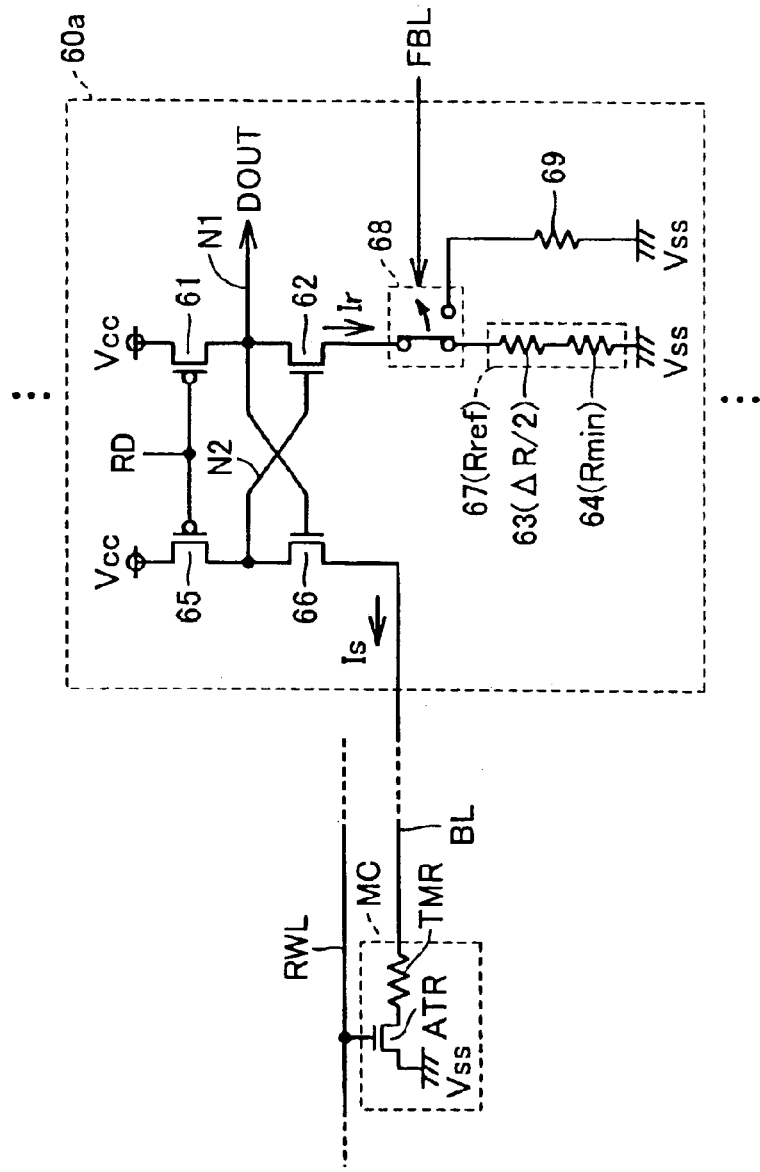
FIG. 12 is a circuit diagram showing the configuration of a current sense amplifier according to the first embodiment.

Referring to FIG. 12, read/write control circuit 22a further includes a current sense amplifier 60a for setting data output signal DOUT to the H or L level in accordance with an amount of current flowing in bit line BL in the selected column. Current sense amplifier 60a has the function of reading data stored in the MTJ memory cell which has not been subjected to destructive writing and, in addition, the function of reading data stored in the MTJ memory cell subjected to destructive writing.

Current sense amplifier 60a is different from current sense amplifier 60 with respect to the point that a switch 68 and a reference resistor 69 are further provided. Since the other configuration is similar to that of current sense amplifier 60, its detailed description will not be repeated. Although current sense amplifier 60a corresponding to one bit line BL is shown in FIG. 12, a similar current sense amplifier is provided in correspondence with a bit line of each memory cell column.

It is assumed that, as an example, selected memory cell MC and sense amplifier 60a are electrically connected to each other via bit line BL. Specifically, a voltage of the H level is applied to the gate of access transistor ATR in selected memory cell MC, and tunneling magneto-resistance element TMR is electrically connected to ground voltage Vss.

Switch 68 is provided between the source of N-channel MOS transistor 62 and reference resistor 67. Switch 68 electrically connects the source of N-channel MOS transistor 62 and reference resistor 67 before destructive writing is performed. After the destructive writing, switch 68 electrically couples the source of N-channel MOS transistor 62 and reference resistor 69 in accordance with final fixed signal FBL. Reference resistor 69 is provided between switch 68 and ground voltage Vss. The resistance value of reference resistor 69 is set to an intermediate value of Rmin and Rbl.

The data reading operation of current sense amplifier 60a will now be described. Since current sense amplifier 60a performs an operation similar to that of current sense amplifier 60 before destructive writing, the detailed description will not be repeated.

After the destructive writing, final fixed signal FBL is inputted to current sense amplifier 60a, and the source of N-channel MOS transistor 62 and reference resistor 69 are electrically coupled to each other. In the case where a selected memory cell is destroyed, the resistance value of tunneling magneto-resistance element TMR in the MTJ memory cell is Rbl. In this case, the relation of Is>Ir is satisfied, so that the potential of node N2 drops. Therefore, the voltage of node N1 becomes Vcc and output signal DOUT is set to the H level.

On the other hand, in the case where the selected memory cell is not destroyed, the resistance value of tunneling magneto-resistance element TMR in the MTJ memory cell is either Rmax or Rmin. In this case, the relation of Is<Ir is satisfied, so that the potential of node N1 drops. As a result, the voltage of node N1 becomes almost 0V and output signal DOUT becomes the L level. As described above, current sense amplifier 60a can read data stored in the MTJ memory cell in any of the cases that the resistance values of tunneling magneto-resistance element TMR before and after the destructive writing are Rmax, Rmin, and Rbl.

An operation of stably destructive-writing a defect address as program information into a desired MTJ memory cell by read/write control circuits 21a and 22a in memory array 10b will be described.

Referring to FIGS. 6, 8, 9 and 12, in response to control signal CMD from control terminal 32, control circuit 30b in memory array 10b makes memory array 10b writable. Address signals PRA and PCA from address terminal 34 are inputted to row decoder 24b and column decoder 23b in memory array 10b, respectively, and a desired MTJ memory cell is selected. At this time, destructive write signal BS of the H level is inputted to read/write control circuits 21a and 22a and word line driver 25b.

In response to destructive write signal BS of the H level, by the operation of driver 81a in word line driver 25b, the voltage of read word line RWL in a selected row becomes ground voltage Vss and that of read word line RWL in a not-selected row becomes voltage Vw.

On the other hand, by the operation of drivers 71a and 71b provided in read/write control circuits 22a and 21a, respectively, the voltage of bit line BL in the selected row becomes destructive write voltage Vb and that of bit line BL in the not-selected row becomes voltage Vw. Since the voltage of the gate of access transistor ATR in the desired MTJ memory cell is set to ground voltage Vss, one end of tunneling magneto-resistance element TMR connected to access transistor ATR becomes electrically open. As a result, destructive write voltage Vb is applied to the other end of tunneling magneto-resistance element TMR in which one end of the desired MTJ memory cell is electrically open, so that the tunnel film in tunneling magneto-resistance element TMR is destroyed.

Current sense amplifier 60a of FIG. 12 can determine that a memory cell whose tunnel film is destroyed stores H-level data and a memory cell whose tunnel film is not destroyed stores L-level data. Consequently, when the defect address is, for example, "1, 1, 0, 0", data of the "H, H, L, L" level is sequentially written into memory cell array 20a. In this case, by performing destructive writing only to the memory cells of the address of writing H-level data, the defect address can be stored into the desired memory cells.

When the destructive writing is finished on all of defect addresses by repeating the above operation, final fixed signal FBL is inputted to each of switches 68 in current sense amplifiers 60a provided in correspondence with a plurality of bit lines in read/write control circuit 22a respectively. As a result, in the case of reading data of memory cell array 20a, after determining that data stored in the memory cell subjected to destructive writing is at the H level and data stored in the memory cell which is not subjected to destructive writing is at the L level, current sense amplifier 60a outputs data. By the above operation, the defect address can be fixed irreversibly to memory cell array 20a and, further, the data subjected to destructive writing can be normally read out.

All of the defect addresses stored in memory cell array 20a are outputted to latch circuit 36 at the time of activation initial operation of MRAM device 102. Since the operation of memory array 10b at this time is similar to that of memory array 10a, its detailed description will not be repeated.

The replacement-repairing operation of MRAM device 102 is similar to that of MRAM device 101 in FIG. 1, so that its detailed operation will not be repeated.

As described above, in the MRAM device according to the first embodiment, program information is written into the memory cell array constructed by a plurality of MTJ memory cells in the MRAM device. Therefore, in the embodiment, unlike a memory device using a fuse element, special equipment such as a trimmer dedicated to laser blowing is unnecessary.

The MRAM device according to the first embodiment can store a defect address in a nonvolatile manner and, moreover, rewrite the data a plurality of times. Therefore, even when the MRAM device is determined to be defective in a test after being packaged, by re-programming, a defective can be repaired. Thus, the yield can be improved.

Further, the MRAM device according to the first embodiment has a configuration that program information constructed by a plurality of bits can be stored into a memory cell on a bit unit basis. Consequently, program information can be stored by using the small number of memory cells.

Further, in the MRAM device according to the first embodiment, by performing the destructive writing described above, even when a strong magnetic field is applied to an MTJ memory cell, there is no fear that data stored in the MTJ memory cell disappears. That is, stored data in the MTJ memory cell can be fixed irreversibly. Moreover, destructive-written data can be normally read out. In the embodiment, therefore, an MRAM device to/from which data is stably stored/read can be provided.

Second Embodiment

Figure 13:
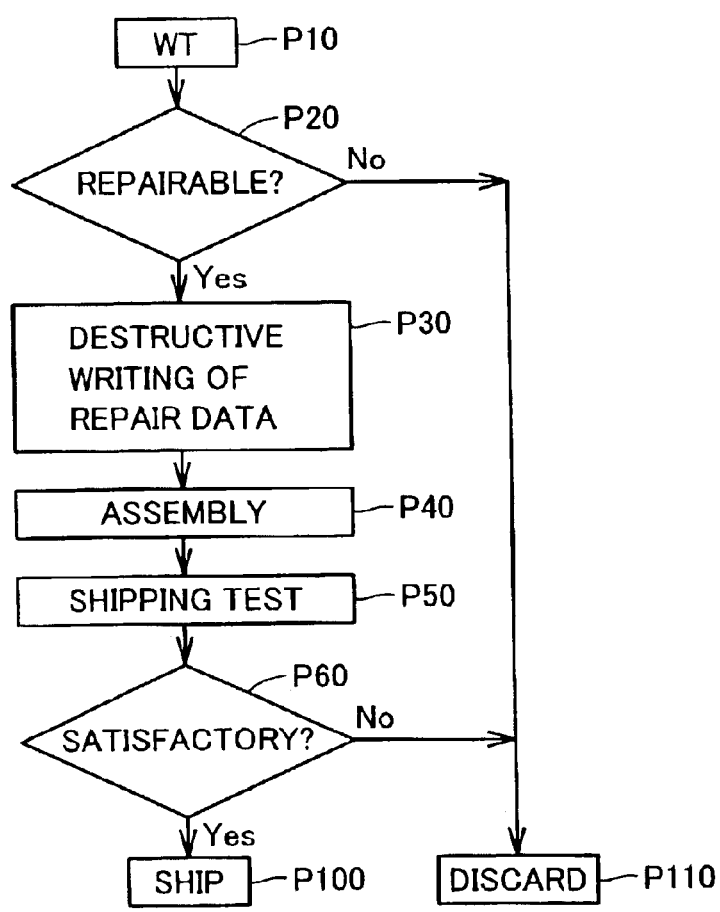
FIGS. 13, 14 and 15 are flowcharts for describing a programming method of program information in an MRAM device according to second, third and fourth embodiments, respectively.

Referring to FIG. 13, a wafer test is conducted on a plurality of MRAM devices on a wafer obtained by a wafer forming process (process P10). In process P20, a repair determination accompanying repair analysis is performed in a wafer state.

An MRAM device determined as unrepairable in process P20 is discarded (process P110). On the other hand, in a redundancy-repairable MRAM device, program information used for redundancy-repairing a detected defective memory cell is stored into a memory in a tester so as to be associated with the device.

The program information read from the memory in the tester is destructive-written into memory array 10b in a corresponding MRAM device (process P30).

The MRAM device to which the program information is destructive written is packaged in an assembly step (process P40). Finally, the packaged MRAM device is subjected to a shipping test (process P50). Whether the MRAM device is satisfactory or not is determined in the shipping test (process P60) and only the satisfactory MRAM device is shipped (process P100). The unsatisfactory MRAM device is discarded (process P110). Since the embodiment relates to the method of programming the program information in MRAM device 102, the program information is stored on a bit unit basis into each of program cells in memory array 10b having the function of a program circuit.

Generally, when a strong magnetic field is applied to an MTJ memory cell, the magnetization direction of free magnetic layer VL in the MTJ memory cell is inverted and there is the possibility that data is lost. However, as described above, by destructive-writing the program information into the MRAM device after determination of the replacement repair with analysis is made, even if a strong magnetic field is applied to the MRAM device by chance in any of the following processes, the program information in the MRAM device is not lost.

As described above, in the MRAM device according to the second embodiment, by destructive-writing the program information into the MRAM device before the assembly process, data loss in the MTJ memory cell can be prevented in the assembly step and subsequent steps.

Third Embodiment

Figure 14:
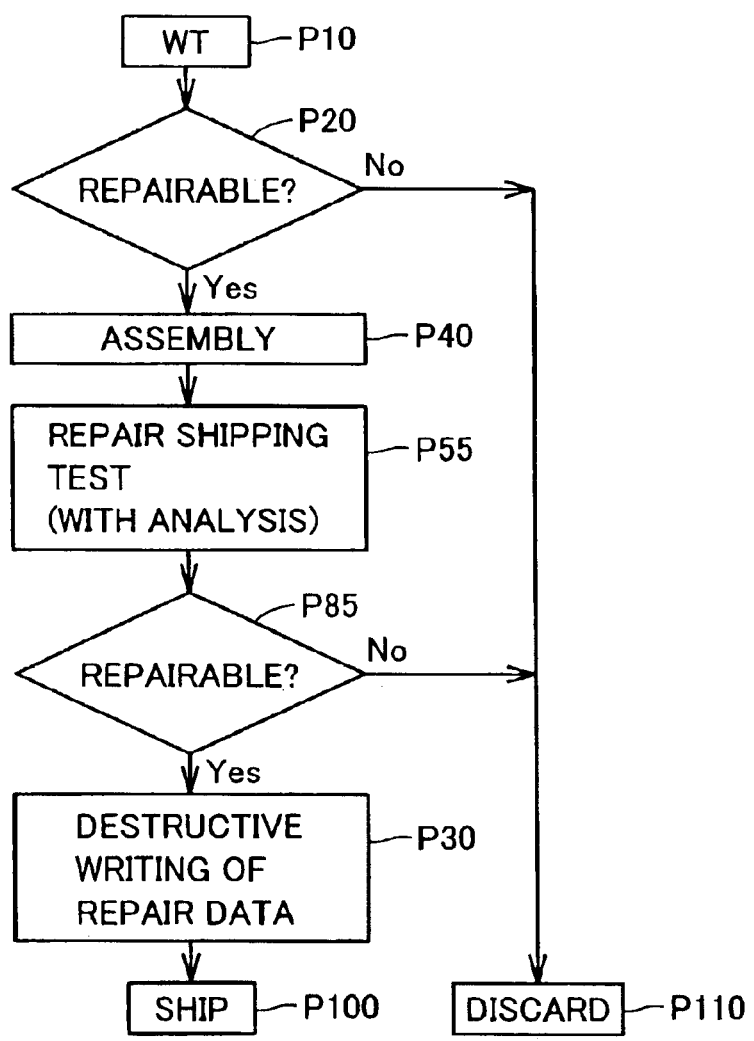

Referring to FIG. 14, a wafer test is conducted on a plurality of MRAM devices on a wafer obtained by a wafer forming process (process P10). In process P20, repair determination accompanying repair analysis is performed in a wafer state.

An MRAM device determined as unrepairable in process P20 is discarded (process P110). On the other hand, in a redundancy-repairable MRAM device, program information used for redundancy-repairing a detected defective memory cell is stored into a memory in a tester so as to be associated with the device.

Unlike the first embodiment, however, the program information stored in the memory in the tester is not written into memory array 10b in the device. The MRAM device is packaged in an assembly step (process P40).

In process P55, the packaged MRAM device is subjected to a shipping test accompanying repair analysis. In process P55, after conducting the shipping test, program information of the MRAM device obtained by the shipping test is stored into the memory in the tester so as to be associated with the device.

After that, whether the MRAM device subjected to the shipping test in process P55 can be repaired or not is determined (process P85). In the repair determination, out of devices tested in process P55, an unrepairable MRAM device is discarded (process P110). On the other hand, in a redundancy-repairable MRAM device, program information corresponding to the device stored in the memory in the tester in process P55 is destructive-written into memory array 10b in the corresponding device (process P30). Finally, the MRAM device to which the program information is destructive written is shipped (process P100). Since the embodiment relates to the method of programming the program information in MRAM device 102, the program information is stored on a bit unit basis into each of program cells in memory array 10b having the function of a program circuit.

As described above, in the MRAM device according to the third embodiment, by performing the repair determination again after assembling, the possibility of repairing devices with a defect which occurs in the assembly step or the like is increased.

Fourth Embodiment

Figure 15:
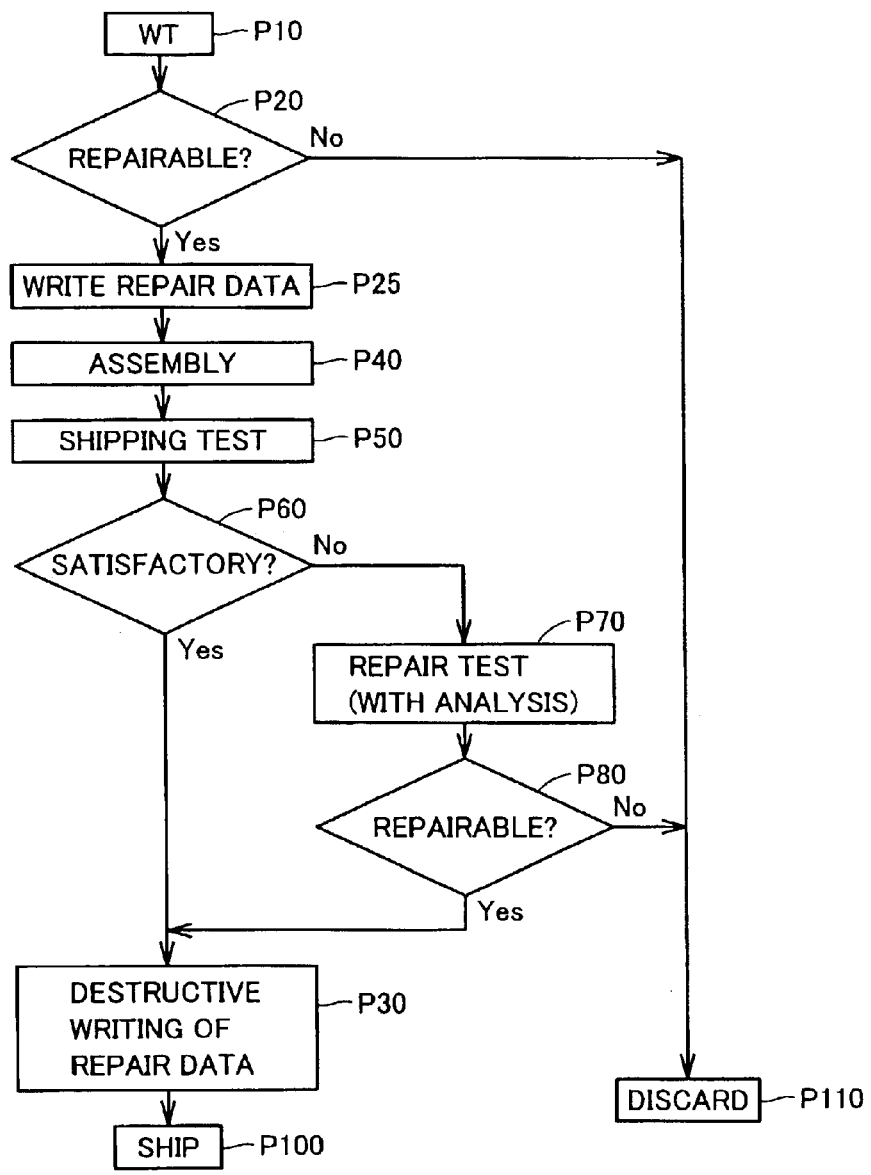
Figure 16:
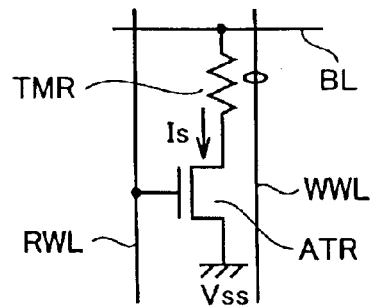
FIG. 16 is a schematic diagram showing the configuration of an MTJ memory cell.
Figure 17:
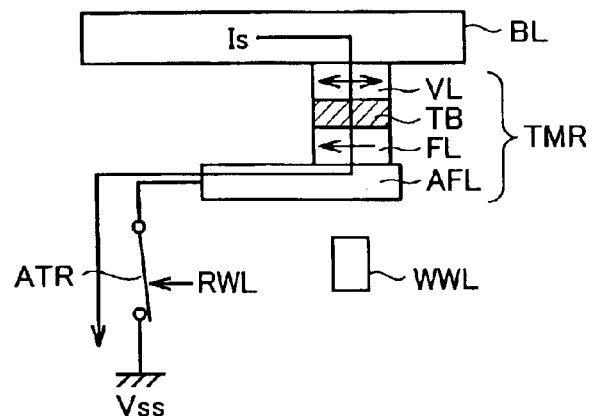
FIG. 17 is a conceptual diagram for describing an operation of reading data from the MTJ memory cell.
Figure 18:
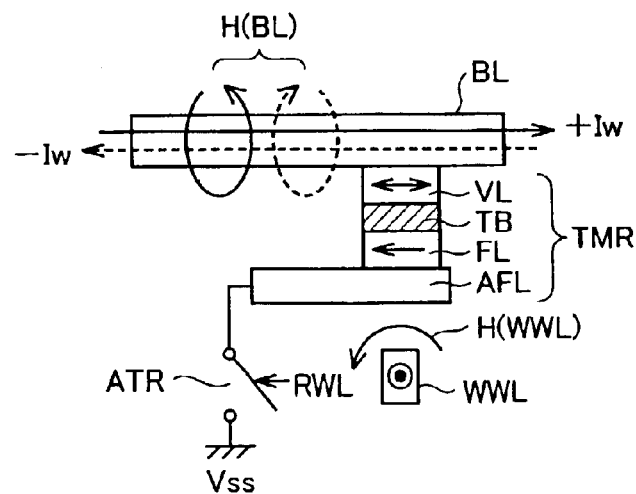
FIG. 18 is a conceptual diagram for describing an operation of writing data to the MTJ memory cell.
Figure 19:
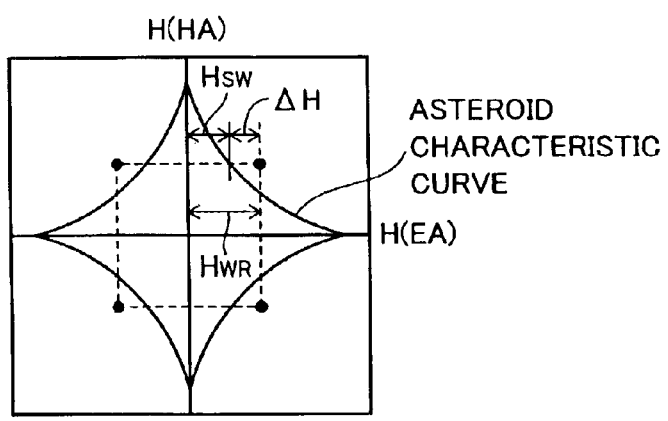
FIG. 19 is a conceptual diagram for describing the relation between a data write current and the magnetization direction of a tunneling magneto-resistance element at the time of writing data to the MTJ memory cell.

Referring to FIG. 15, a wafer test is conducted on a plurality of MRAM devices on a wafer obtained by a wafer forming process (process P10). In process P20, repair determination accompanying repair analysis is performed in a wafer state.

An MRAM device determined as unrepairable in process P20 is discarded (process P110). On the other hand, in a redundancy-repairable MRAM device, program information used for redundancy-repairing a detected defective memory cell is stored into a memory in a tester so as to be associated with the device.

Subsequently, the program information read from the memory in the tester is not destructive-written into memory array 10b in the corresponding device but is normally written so that the data can be rewritten (process P25).

The MRAM device to which the program information is normally written is packaged in an assembly step (process P40). The packaged MRAM device is subjected to a shipping test (process P50). Whether the MRAM device is satisfactory or not is determined in the shipping test (process P60). In process P70, a repair test accompanying repair analysis is performed on the MRAM device determined as unsatisfactory in process P60.

In the repair test in the process P70, program information of the packaged MRAM device as an object of the test is stored into the memory in the tester so as to be associated with the device.

Since the test is performed on the packaged devices one by one in the repair test in process P70, time required for the test is longer than that required for the test on the wafer.

However, MRAM devices to be subjected to the repair test in process P70 generally occupy only a few percentages of all of MRAM devices to be tested. Therefore, time required for the repair test in process P70 is time which is ignorably short when compared with time necessary to test all of MRAM devices.

After that, whether the MRAM device subjected to the repair test in process P70 can be repaired or not is determined (process P80). In the repair determination, an MRAM device which cannot be redundancy repaired is discarded (process P110). On the other hand, in an MRAM device which is determined to be redundancy-repairable, program information written in process P25 is rewritten to program information obtained by the repair test with analysis in process P70. That is, the program information once written before an assembly step can be rewritten after the assembly step.

In the MRAM device which is determined to be satisfactory in process P60, the program information written in memory array 10b in process P25 is destructive written in memory array 10b in the corresponding device. In the MRAM device which is determined to be repairable in process P80, the program information stored in the memory in the tester in process P70 is destructive written in memory array 10b in the corresponding device. Finally, the MRAM device to which the program information is destructive written is shipped (process P100). Since the embodiment relates to the method of programming the program information in MRAM device 102, the program information is stored on a bit unit basis into each of program cells in memory array 10b having the function of a program circuit.

As described above, in the MRAM device according to the fourth embodiment, even when a defect is found in a product in a shipping test after the assembly step, a repair test with analysis is conducted on the defective product. Program information obtained by the repair test with analysis can be re-programmed and re-stored into the memory device, so that the possibility of repairing products with a defect which occurs in the assembly process or the like increases.

Since the repair test is conducted on only a device which did not pass the shipping test conducted after the assembly process, while assuring the yield which is about the same as that of the third embodiment, manufacturing time can be shortened.

Although the configuration in which a defect address for specifying a defective memory cell is stored as program information into memory array 10b has been described representatively in the first to fourth embodiments, application of the present invention is not limited to such a configuration.

It is also possible to store, as program information, an operating condition regarding an internal circuit of an MRAM device, an operation mode of an MRAM device, and the like by using memory array 10b according to the present invention.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A thin film magnetic memory device comprising:
   a memory array in which a plurality of memory cells each magnetically storing data are arranged in a matrix; and
   a program circuit for storing information used for at least one of an operation of reading data and an operation of writing data from/to said plurality of memory cells, wherein
      said program circuit includes a plurality of program cells each for storing program data constructing said information,
      each of said memory cells and said program cells has a magnetic storing part having first and second electric resistances in correspondence with two magnetization directions respectively, and
      said program circuit further includes:
         a driver circuit for irreversibly fixing electric resistance in said magnetic storing part in selected one of said plurality of program cells to a third electric resistance with physical destruction; and
         a sense driver circuit capable of sensing which one of said first and second electric resistances is provided for said magnetic storing part in selected one of said plurality of program cells in a first mode,
      said sense driver circuit can sense whether any one of said first and second electric resistances, or third electric resistance is provided for said magnetic storing part in selected one of said plurality of program cells in a second mode, and
      said first electric resistance is larger than said second electric resistance, and said second electric resistance is larger than said third electric resistance.

2. The thin film magnetic memory device according to claim 1, wherein
   said memory array further includes a redundancy circuit which is disposed for a predetermined unit of said plurality of memory cells and replaces said predetermined unit including a defective memory cell,
   said program data stored in said program circuit includes a defect address specifying said predetermined unit including said defective memory cell, and
   said thin film magnetic memory device further comprises a redundancy control circuit for controlling an access to said redundancy circuit on the basis of a result of comparison between at least a part for selecting said predetermined unit in an input address signal and said defect address stored in said program circuit.

3. The thin film magnetic memory device according to claim 1, wherein
   said program circuit further includes a plurality of data lines each of which is electrically connected to a part of said plurality of program cells,
   said driver circuit applies a first voltage to that selected one of said plurality of data lines, which electrically connected to at least one of said plurality of program cells in a predetermined mode,
   one end of said magnetic storing part in one of said plurality of program cells is open, said first voltage applied to the other end of said magnetic storing part is set to a level at which said magnetic storing part can be physically destroyed in said predetermined mode, and
   in order to magnetically write data to at least one of said plurality of program cells in a mode other than said predetermined mode, said driver circuit applies second and third voltages in accordance with said data to one end and the other end of selected one of said plurality of data lines, respectively.

4. The thin film magnetic memory device according to claim 3, wherein
   said first voltage is larger than said second voltage, and said second voltage is larger than said third voltage.

5. The thin film magnetic memory device according to claim 1, wherein
   said sense driver circuit has:
      a detection circuit for detecting the difference between electric resistance of selected one of said plurality of program cells and electric resistance connected to an internal node; and
      a switch for connecting said internal node to a first reference resistance in said first mode and connecting said internal node to a second reference resistance in said second mode,
   said first reference resistance has electric resistance which is intermediate between said first and second electric resistances, and
   said second reference resistance has electric resistance which is intermediate between said second and third electric resistances.

6. A method of fabricating a thin film magnetic memory device including a plurality of memory cells each for magnetically storing data, comprising:
   a repair determining step of determining whether a device can be repaired or not on the basis of a result of a wafer test;
   a program fixing step which is executed after said repair determining step and irreversibly stores information for repairing the device obtained by said wafer test into a program circuit for the device which is determined to be repairable in said repair determining step; and an assembly step executed after said program fixing step, wherein
- said program circuit includes a plurality of program cells each magnetically storing program data used for programming said information,
- each of said program cells in said program circuit has a magnetic storing part for storing data when being magnetized in one of two directions, and
- electric resistance of said magnetic storing part in each of said program cells in which said program data is stored is fixed by a physical destructive operation in said program fixing step.

7. A method of fabricating a thin film magnetic memory device including a plurality of memory cells each for magnetically storing data, comprising:

a repair determining step of determining whether a device can be repaired or not on the basis of a result of a wafer test;

an assembly step executed for the device determined to be repairable in said repair determining step; and a program fixing step which is executed after said assembly step and irreversibly stores information for repairing the device obtained by said wafer test into a program circuit, wherein
- said program circuit includes a plurality of program cells each magnetically storing program data used for programming said information,
- each of said program cells in said program circuit has a magnetic storing part for storing data when being magnetized in one of two directions, and
- electric resistance of said magnetic storing part in each of said program cells in which said program data is stored is fixed by a physical destructive operation in said program fixing step.

* * * * *